(12) United States Patent
Bell

(10) Patent No.: US 6,762,646 B1
(45) Date of Patent: Jul. 13, 2004

(54) MODIFIED FOLDED CASCODE AMPLIFIER

(75) Inventor: Marshall J. Bell, Chandler, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/263,571

(22) Filed: Oct. 2, 2002

(51) Int. Cl.[7] ................................................. H03F 3/45
(52) U.S. Cl. ...................................... 330/257; 330/292
(58) Field of Search ................................. 330/252, 253, 330/257, 292, 311

(56) References Cited

U.S. PATENT DOCUMENTS 5,475,339 A * 12/1995 Maida ..................... 330/257 X

* cited by examiner

Primary Examiner—Steven J. Mottola
(74) Attorney, Agent, or Firm—Brett A. Hertzberg; Merchant & Gould, P.C.

(57) ABSTRACT

A folded-cascode amplifier is arranged with a differential pair circuit, a current mirror circuit, and a cascode circuit. The differential pair is coupled to the current mirror circuit, while the cascode circuit is only coupled to one half of the current mirror circuit. A minimum number of transistors are employed such that overall speed is improved. An output stage with a compensation circuit may be coupled to an output of the cascode circuit. The cascode circuit is configured such that the compensation capacitor is driven with a current of approximately +/−2*I when slewing in the positive and negative directions.

19 Claims, 3 Drawing Sheets

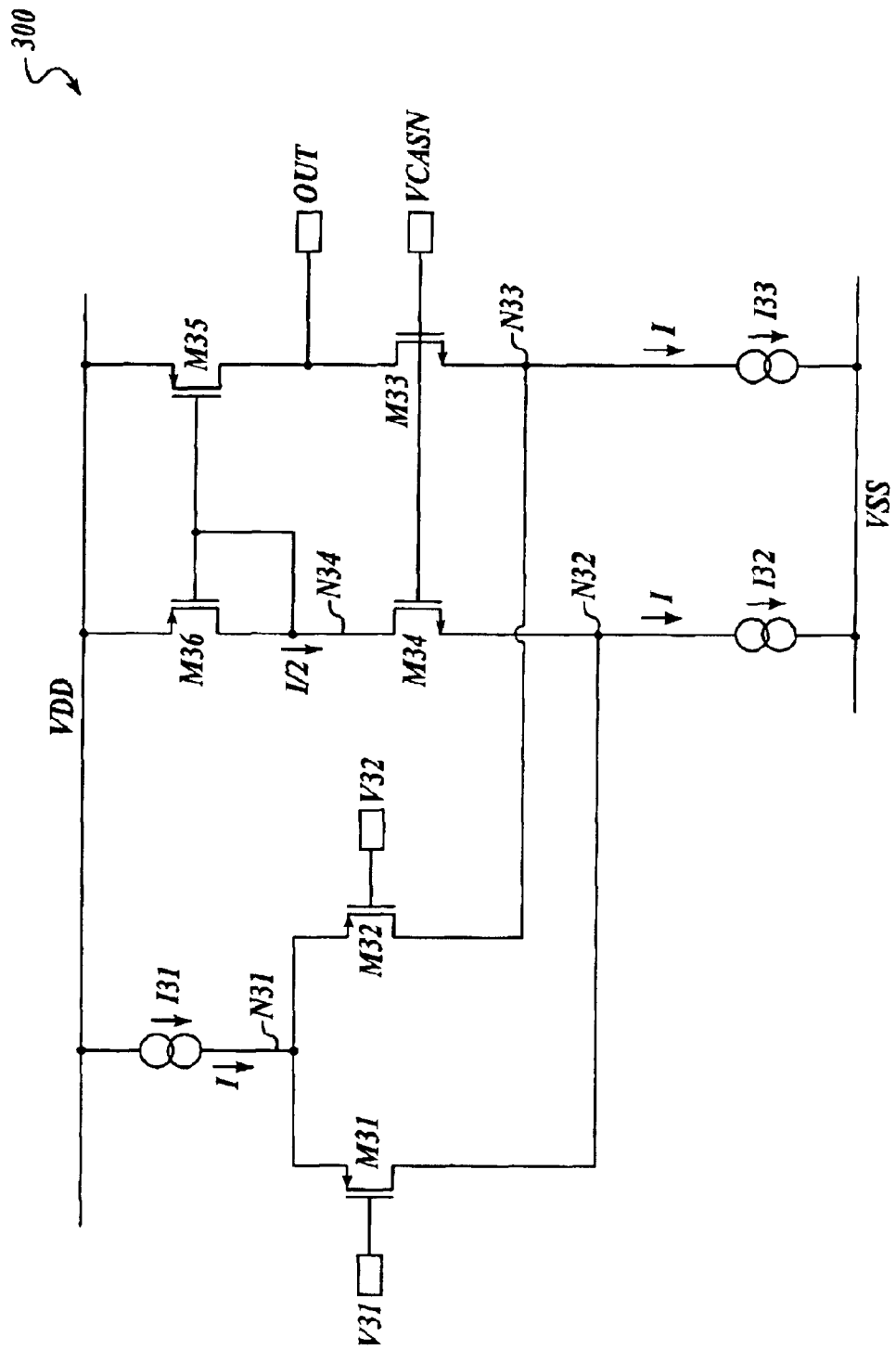
Fig. 3. *(PRIOR ART)*

MODIFIED FOLDED CASCODE AMPLIFIER

FIELD OF THE INVENTION

The present invention is generally related to operational amplifiers. More particularly, the present invention relates to an improved folded-cascode amplifier that is suitable for high-speed operation.

BACKGROUND OF THE INVENTION

A conventional operational amplifier (300) is illustrated in FIG. 3. The operational amplifier (300) includes six transistors (M31–M36), and three current sources (I31–I33).

Transistor M31 includes a source that is connected to node N31, a gate that is connected to V31, and a drain that is connected to node N32. Transistor M32 includes a source that is connected to node N31, a gate that is connected to V32, and a drain that is connected to node N33. Transistor M33 includes a source that is connected to node N33, a gate that is connected to VCASN. Transistor M34 includes a source that is connected to node N32, a gate that is connected to VCASN, and a drain that is connected to node N34. Transistor M35 includes a source that is connected to VDD, a gate that is connected to node N34, and a drain that is connected to OUT. Transistor M36 includes a source that is connected to VDD, and a gate and drain that are connected to node N34. Current source I31 is connected between VDD and node N31. Current source I32 is connected between node N32 and VSS. Current source I33 is connected between N33 and VSS.

In operation, transistors M35 and M36 are arranged as a current mirror, while transistors M33 and M34 are cascode transistors that are biased by VCASN. A differential voltage is applied across V31 and V32. Transistors M31 and M31 cooperate with current source I31 to operate as a differential pair circuit that steers current to nodes N32 and N33 in response to the differential voltage. The current that is provided to nodes N32 and N33 corresponds to I/2 when V31 and V32 are equal.

SUMMARY OF THE INVENTION

According to an example of the present invention, an amplifier circuit is provided that include a differential pair circuit, a current mirror circuit, and a cascode circuit. The differential pair circuit is arranged to steer a tail current between first and second nodes in response to a differential signal. The current mirror circuit is coupled to the first and second nodes, wherein the current mirror circuit is arranged to provide a reflected current to the second node when activated by at least a portion of the tail current. The cascode circuit is biased by a cascode current, wherein the cascode circuit is coupled between a cascode output node and the first node such that first node is isolated from the cascode output node by the cascode circuit, wherein the amplifier is arranged to provide an output current to the cascode output node.

According to another example of the present invention, an apparatus is provided that includes a differential pair circuit, a current mirror circuit, and a cascode circuit. The differential pair circuit includes a first current source that is coupled to a third node, a first transistor that is coupled between a first node and the third node, and a second transistor that is coupled between a second node and the third node. The first and second transistors are arranged to steer a tail current from the first current source to the first and second nodes in response to a differential signal. The current mirror circuit is coupled to the first and second nodes. The current mirror circuit includes a fourth transistor that is coupled between the first node and a fourth node, a fifth transistor that is coupled to the first node and the second node, and a sixth transistor that is to the first node and the fourth node. The fifth and sixth transistors are commonly controlled by a signal from the first node such that a reflected current is provided to the second node when the sixth transistor is activated by at least a portion of the tail current. The cascode circuit includes a second current source that is coupled to a fifth node, and a third transistor that is coupled between the fifth node and the second node. The third transistor is biased by a cascode bias signal such that the amplifier is arranged to provide a cascode output current to the fifth node.

According to one aspect, the first current source is arranged to provide a tail current having a magnitude corresponding to I1, while the second current source is arranged to provide a cascode current having a magnitude corresponding to I2. The fifth and sixth transistors have associated sizes that are related to one another by a ratio that corresponds to: $1+2*(I2/I1)$.

According to another aspect, the second transistor is arranged to provide the tail current to the second node when the fifth transistor is deactivated, and the fifth transistor is arranged to conduct another current having a magnitude corresponding to $I1+2*I2$ when the second transistor is deactivated.

According to still another aspect, the first current source is arranged to provide a tail current having a magnitude corresponding to I1, the second current source is arranged to provide a cascode current having a magnitude corresponding to I2, and the third and fourth transistors have associated sizes that are related to one another by a ratio that corresponds to: $2*(I2/I1)$.

According to a further aspect an output stage is provided that includes an eighth transistor that is coupled to the fifth node and an output node. The eighth transistor is arranged to provide an output signal to the output node in response to signals at the fifth node. A capacitor (C) may be coupled between the second node and the output node, wherein the first current source is arranged to provide a tail current having a magnitude corresponding to I1, and the second current source is arranged to provide a cascode current having a magnitude corresponding to I2 such that the amplifier charges capacitor C with a positive slew rate (SRP) corresponding to: $SRP=(I1+I2)/C$. Furthermore, the fifth transistor may be ratioed in size to the sixth transistor according to a factor (X). When transistor M1 has a parasitic capacitance (CP) that is coupled to node N3, the amplifier discharges capacitor C with a negative slew rate (SRN) corresponding to: $SRN=((X*I1)-I2)/(C+CP)$. When the value associated with the parasitic capacitance (CP) is much less than the value associated with the capacitor (C), the negative slew rate (SRN) is $SRN=((X*I1)-I2)/C$.

A more complete appreciation of the present invention and its improvements can be obtained by reference to the accompanying drawings, which are briefly summarized below, the following detail description of presently preferred embodiments of the invention, and the appended claims.

BRIEF DESCRIPTION OF THE DRAWINGS

FIG. 3 is a schematic diagram of a conventional folded-cascode amplifier.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function.

The present invention is generally related to operational amplifiers. More particularly, the present invention relates to an improved folded-cascode amplifier that is suitable for high-speed operation. Briefly stated, an improved folded-cascode amplifier is arranged with a differential pair circuit, a current mirror circuit, and a cascode circuit. The differential pair is coupled to the current mirror circuit, while the cascode circuit is only coupled to one half of the current mirror circuit. A minimum number of transistors are employed such that overall speed is improved. An output stage with a compensation circuit may be coupled to an output of the cascode circuit. The cascode circuit is configured such that the compensation capacitor is driven with a current of approximately +/−2*I when slewing in the positive and negative directions.

The above-described features, as well as others, will be described below with reference to the accompanying drawings.

FIRST EXEMPLARY FOLDED-CASCODE AMPLIFIER

Figure 1:
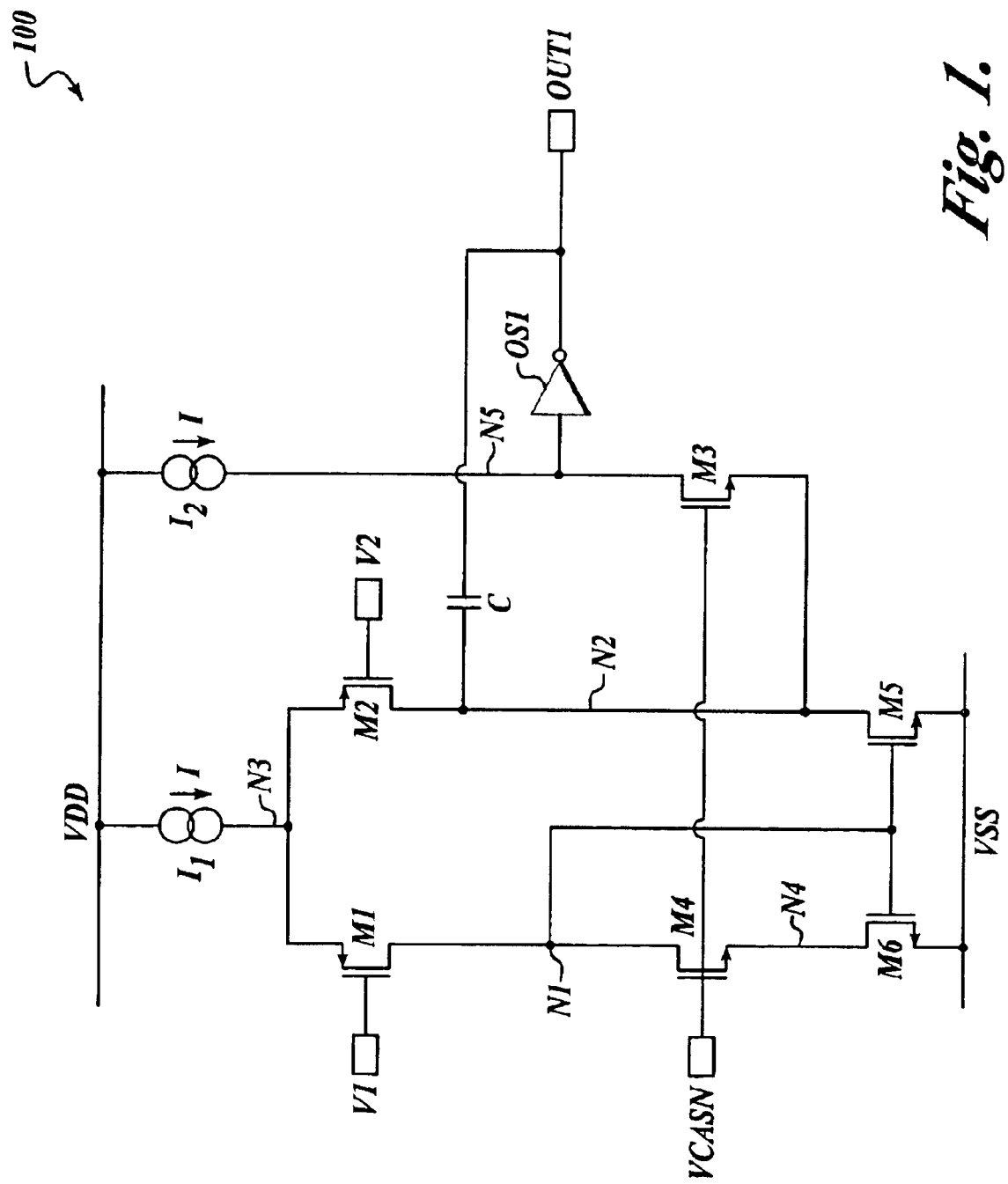
FIG. 1 is a schematic diagram of an exemplary folded-cascode amplifier that is arranged in accordance with the present invention.

FIG. 1 is a schematic diagram of an exemplary folded-cascode amplifier (100) that is arranged in accordance with the present invention. The exemplary folded cascode amplifier (100) includes six transistors (M1–M6), two current sources (I1–I2), a capacitor (C), and an output stage (OS1).

Transistor M1 includes a source that is coupled to node N3, a gate that is coupled to V1, and a drain that is coupled to node N1. Transistor M2 includes a source that is coupled to node N3, a gate that is coupled to V2, and a drain that is coupled to node N2. Transistor M3 includes a source that is coupled to node N2, a gate that is coupled to VCASN, and a drain that is coupled to node N5. Transistor M4 includes a source that is coupled to node N4, a gate that is coupled to VCASN, and a drain that is coupled to node N1. Transistor M5 includes a source that is coupled to VSS, a gate that is coupled to node N1, and a drain that is coupled to node N2. Transistor M6 includes a source that is coupled to VSS, a gate that is coupled to node N1, and a drain that is coupled to node N4. Current source I1 is coupled between nodes VDD and N3. Current source I2 is coupled between VDD and node N5. Output stage OS1 is coupled between node N5 and an output terminal (OUT1). Capacitor C is coupled between node N2 and the output terminal (OUT1).

In operation, current sources I1 and I2 each provide a current with a magnitude of I. A differential signal is applied across V1 and V2. Transistors M1 and M2 cooperate with current source I1 to form a differential pair circuit. The differential pair steers the tail current (I) between nodes N1 and N2 in response to the differential signal. All of the tail current (I) is coupled to node N1 when V1<<V2. All of the tail current (I) is coupled to node N2 when V2<<V1. The tail current (I) is equally split between nodes N1 and N2 when V1=V2.

Transistors M5 and M6 are arranged to operate as a current mirror, sharing common gate and source connections. Transistors M4 and M6 are arranged to operate as a cascode current mirror, which reflects the current to transistor M5. Transistor M4 is biased into saturation (e.g., the VDS(M4)>>VGS(M4)–VTH(M4)) by VCASN, which is provided by a biasing circuit (not shown). Transistors M5 and M6 have gate potentials that are coupled to node N1 such that the potential associated with node N1 must be at least one N-type FET threshold voltage (VTN) above VSS for proper operation.

Transistor M5 and M6 are matched to one another such that they each have comparable current densities. Since current from current source I2 is coupled to the drain of transistor M5, the sizing of transistor M5 must account for the additional current. For the example illustrated in FIG. 1, current source I1 and I2 each provide a current with a magnitude of I. The signal at node N5 should be exactly zero when V1=V2, which results in an equal split in the tail current from current source I1 through transistors M1 and M2. In this condition, the total current that is flowing through transistor M5 corresponds to I*(3/2), while the total current running through transistor M6 corresponds to I*(1/2). For this example, transistor M5 is optimally sized three times (3x) the size of transistor M6 such that they have equal current densities. Other optimal size ratios between transistors M5 and M6 are required when the magnitudes of the currents from current sources I1 and I2 are changed. Since NMOS transistors are typically faster than PMOS transistors, NMOS transistors are utilized for the current mirror (transistors M5 and M6).

Transistor M4 is arranged to reduce the drain voltage associates with transistor M6 such that the drain-source voltage (VDS) associated with transistors M5 and M6 are comparable, resulting in reduced offset and improved matching in the current mirror. Transistors M3 and M4 are matched to each other such that they each have comparable current densities. For example, when current sources I1 and I2 each provide a current magnitude of (I), transistor M3 is optimally twice (2x) the size of transistor M4 (1x). The source voltage associated with transistors M3 and M4 are matched when V1=V2. In instances where offset voltages are not as a big of a concern, transistor M4 may be eliminated, and transistor M6 will be configured to operate as a diode device.

Transistor M3 is arranged to operate as a cascode circuit. The cascode circuit increases the impedance looking into the drain of transistor M5 from the node N5. For small differential input signals transistor M3 couples current from current source I2 to the drain of transistor M5. All of the current (I) from current source I2 is available to drive the output stage (OS1) when transistor M5 is deactivated. Also, none of the current (I) from current source I2 is available for the output stage (OS1) when transistor M5 is fully activated.

The current that is reflected by transistor M5 in the current mirror decreases to zero when transistor M1 is deactivated and transistor M2 is activated by a positive differential input signal. Since transistor M2 is fully activated, all of the tail current (I) from current source I1 and all of the current (I)

from current source I2 is driven into node N2, resulting in a rapid increase in the drain voltage associated with transistor M5 (and source voltage of transistor M3). Since transistor M5 is deactivated, all of the current (I) from transistor M2 will be diverted to the output stage (OS1) through transistor M3. The current that is available to the output stage (OS1) corresponds to 2*I when transistor M5 is deactivated, which is all of the current from current sources I1 and I2.

The current that is reflected by transistor M5 in the current mirror reaches a maximum when transistor M1 is activated and transistor M2 is deactivated by a negative differential signal. Since transistor M1 is fully activated, all of the tail current (I) from current source I1 is driven into node N1, resulting in an increase in the current in transistor M5 of the current mirror. The maximum current that is sunk by transistor M5 is determined by the ratio of the sizes associated with transistors M5 and M6, and the magnitude of the tail current. In one example, the maximum current that is sunk by transistor M5 corresponds to 3*I, when transistor M5 is three times (3×) the relative size of transistor M6 and the tail current has a magnitude corresponding to I.

Current sources I1–I2 may correspond to transistors that are biased to operate as current sources. For example, a matched set of P-type field effect transistors (or bipolar junction transistors) that are biased by a common bias signal may be employed as current sources I1–I2. Alternatively, matched resistor circuits may replace current sources I1–I2. Similarly, alternative circuits that provide the function of a current source may replace the current sources.

Output stage OS1 is configured to receives a drive signal from node N5, and provide an output signal to output terminal OUT1. The output signal corresponds to an inversion between node N5 and output terminal OUT2. Any appropriate inverting output stage may be employed including, but not limited to, a class A output stage, a class B output stage, a class AB output stage, as well as others. An exemplary output stage that may be employed is described in further detail with respect to FIG. 2.

The overall design of cascode amplifier 100 is illustrated as P-type transistors in the differential pair, and N-type transistors in the cascode circuit and the current mirror circuit. However, the overall design of the cascode amplifier may be "flipped over" such that the differential pair is formed with N-type transistors, while the cascode circuit and the current mirror circuit are formed with P-type transistors.

The transistors illustrated in FIG. 1 are field effect transistors (FETS) such as metal-oxide semiconductor (MOS) devices. However, the same circuit configuration is equally applicable for bipolar junction transistors (BJTs). Other example circuits that perform the functions described above are considered within the scope of the present invention.

SECOND EXEMPLARY FOLDED-CASCODE AMPLIFIER

Figure 2:
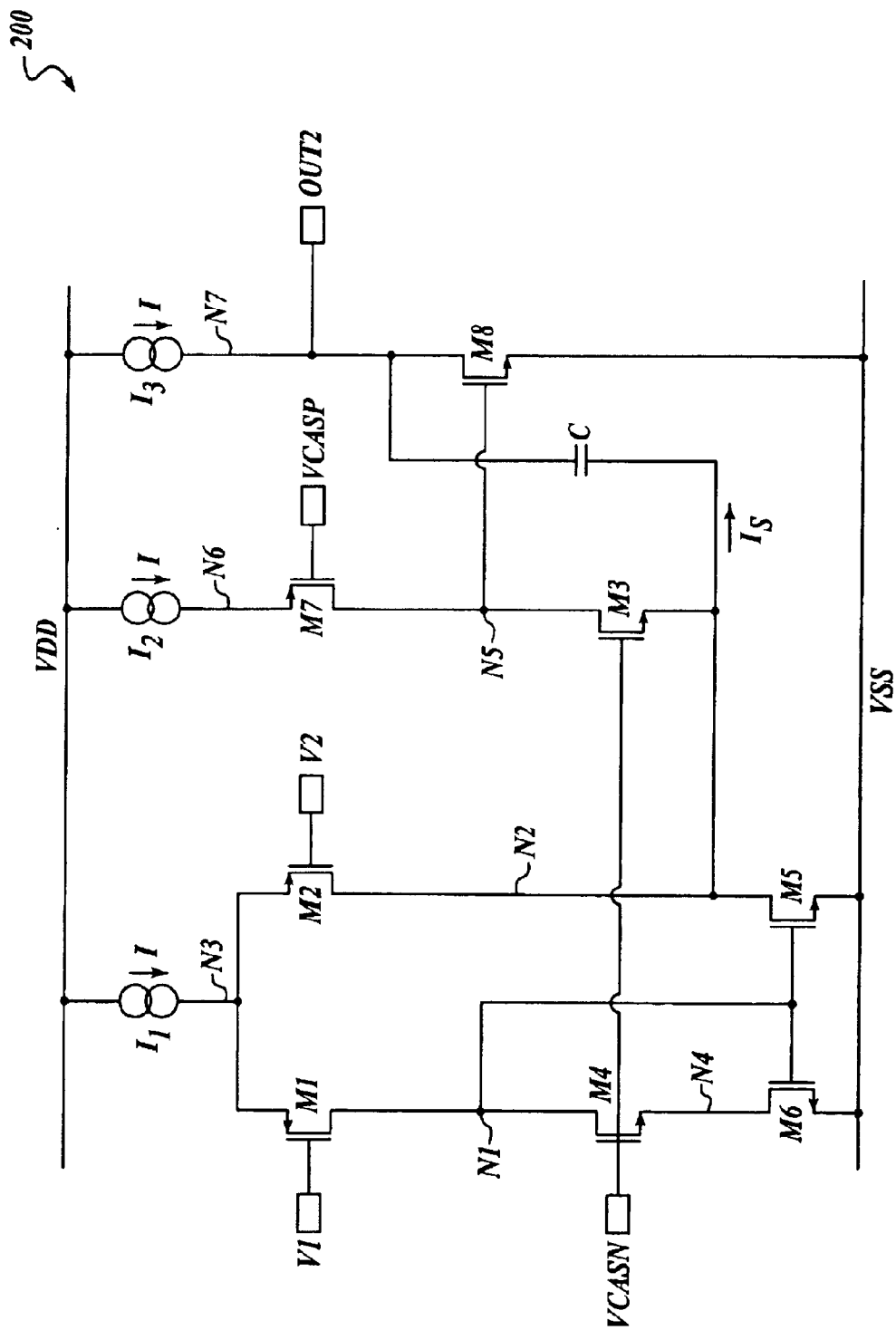
FIG. 2 is a schematic diagram of another exemplary folded-cascode amplifier that is arranged in accordance with the present invention.

FIG. 2 is a schematic diagram of another exemplary folded-cascode amplifier (200) that is arranged in accordance with the present invention. The exemplary folded cascade amplifier (200) includes eight transistors (M1–M8), and three current sources (I1–I3).

Transistor M1 includes a source that is coupled to node N3, a gate that is coupled to V1, and a drain that is coupled to node N1. Transistor M2 includes a source that is coupled to node N3, a gate that is coupled to V2, and a drain that is coupled to node N2. Transistor M3 includes a source that is coupled to node N2, a gate that is coupled to VCASN, and a drain that is coupled to node N5. Transistor M4 includes a source that is coupled to node N4, a gate that is coupled to VCASN, and a drain that is coupled to node N1. Transistor M5 includes a source that is coupled to VSS, a gate that is coupled to node N1, and a drain that is coupled to node N2. Transistor M6 includes a source that is coupled to VSS, a gate that is coupled to node N1, and a drain that is coupled to node N4. Transistor M7 includes a source that is coupled to node N6, a gate that is coupled to VCASP, and a drain that is coupled node N5. Transistor M8 includes a source that is coupled to VSS, a gate that is coupled to node N5, and a drain that is coupled to node N7. Capacitor C is coupled between node N3 and node N7. Current source I1 is coupled between nodes VDD and N3. Current source I2 is coupled between VDD and node N6. Current source I3 is coupled between VDD and node N7.

Transistors M1–M6 in FIG. 2 are arranged to provide the same functions as transistors M1–M6 from FIG. 1. Transistor M7 is an optional cascode transistor that is biased by bias signal VCASP, which is provided from a biasing circuit (not shown). Transistor M7 is arranged to increase the impedance looking into current source I2 from node N5. Transistor M8 and current source I3 are arranged to operate as an inverting output stage (i.e., an inverting gain stage) that is responsive to the signal at node N5. Capacitor C is arranged to compensate the high gain node (N2) for stability by reducing the high-frequency gain using Miller compensation.

In one example, the current mirror transistors (e.g., M5, M6) are NMOS transistors, since NMOS transistors are faster than PMOS transistors. For this example, the NMOS transistors permit the use of a smaller compensation capacitor (C) when compared to a PMOS current mirror.

The slew rate that is associated with folded-cascode amplifier 200 is determined by various parasitic capacitances, the gain of the amplifier, and the size of the compensation capacitor. The slew rate of amplifier 200 is predominately determined by the current (IS) that is available to charge and discharge the compensation capacitor (C). The maximum current that is available to charge capacitor C corresponds to 2*I when transistor M5 is deactivated (see previous discussion with respect to FIG. 1). The positive slew rate (SRP) is determined as: SRP=2*I/C.

Also described previously with respect to FIG. 1, the maximum current that is sunk through transistor M5 corresponds to 3*I. Since a current corresponding to I is required to bias transistor M3, the current that is available to discharge the capacitor towards VSS has a maximum magnitude of 2*I. However, transistor M1 has a parasitic gate capacitance that may adversely impact the negative slew rate associated with amplifier 200.

Transistor M2 will steer all of the tail current (I) to node N2 such that transistor M1 is deactivated when transistor M2 is fully activated by the differential input signal. Transistor M1 has a parasitic gate capacitance (CP) that is coupled between the gate of transistor M2 and node N3 (the tail) through the substrate. As the output begins to change, the available current that flows through transistor M2 is reduced by the current that is required to charge the gate capacitance associated with transistor M2. The negative slew rate (SRN) associated with amplifier 200 is determined by: SRN=−2*I/(C+CP). The negative slew rate is simplified when the gate capacitances are dominated by the compensation capacitor. Thus, the negative slew rate corresponds to: SRN=−2*I/C, when C>>CP.

As stated previously, the available current for slewing is determined by current source I1, current source I2, and the ratio of transistor sizes for transistors M5 and M6. The overall amplifier design can be modified for various operating currents. For example, when transistor M5 is X times bigger than transistor M6, then the available current for negative slewing is provided by transistor M5 as: (I*X−I2). Similarly, the available current for positive slewing is provided by transistor M2 and transistor M3 as: (I1+I2). Accounting for the parasitic capacitance from the gate of transistor M1 yields slew rates that are given as:

$SRN=((X*I1)-I2)/(C+CP)$, and $SRP=(I1+I2)/C$.

Current sources I1–I3 may correspond to transistors that are biased to operate as current sources. For example, a matched set of P-type field effect transistors (or bipolar junction transistors) that are biased by a common bias signal may be employed as current sources I1–I3. Alternatively, matched resistor circuits may replace current sources I1–I3. Similarly, alternative circuits that provide the function of a current source may replace the current sources.

As described previously, transistor M8 and current source I3 are arranged to operate as an inverting output stage (i.e., an inverting gain stage) that is responsive to the signal at node N5. However, transistor M8 and current source I3 may be replaced by any inverting output stage including, but not limit to, a class A output stage, a class B output stage, a class AB output stage, as well as others.

The overall design of cascode amplifier 200 is illustrated as P-type transistors in the differential pair, and N-type transistors in the current mirror circuit and the cascode circuit (ignoring transistor M7 which is optional). However, the overall design of the cascode amplifier may be "flipped over" such that the differential pair is formed with N-type transistors, while the current mirror circuit and the cascode circuit are formed with P-type transistors (except for M7 which would be replaced by an N-type transistor).

The transistors illustrated in FIG. 2 are field effect transistors (FETs) such as metal-oxide semiconductor (MOS) devices. However, the same circuit configuration is equally applicable for bipolar junction transistors (BJTs). Other example circuits that perform the functions described above are considered within the scope of the present invention.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An amplifier circuit, comprising:
   a differential pair circuit that is arranged to steer a tail current between first and second nodes in response to a differential signal;
   a current mirror circuit that is coupled to the first and second nodes, wherein the current mirror circuit is arranged to provide a reflected current to the second node when activated by at least a portion of the tail current, wherein the current mirror circuit includes: a sixth transistor that is coupled to the first node, and a fifth transistor that is coupled to the second node, wherein the fifth and sixth transistors are commonly controlled by a signal from the first node; and
   a cascode circuit that is biased by a cascode current, wherein the cascode circuit is coupled between a cascode output node and the second node such that second node is isolated from the cascode output node by the cascode circuit, wherein the amplifier is arranged to provide an output current to the cascode output node.

2. The amplifier circuit of claim 1, wherein the differential pair circuit includes a first current source that is arranged to provide the tail current, a first transistor that is arranged to steer the tail current to the first node in response to the differential signal, and a second transistor that is arranged to steer the tail current to the second node in response to the differential signal.

3. The amplifier circuit of claim 1, wherein the fifth and sixth transistors have associated sizes, and wherein the size associated with the fifth transistor is related to the size associated with the sixth transistor by a factor that is different from one.

4. The amplifier circuit of claim 1, wherein the current mirror circuit further includes a fourth transistor that is coupled between the first node and the sixth transistor, wherein the fourth transistor is arranged to reduce the voltage across the sixth transistor to minimize current reflection errors between the fifth and sixth transistors such that an offset associated with the amplifier is reduced.

5. The amplifier circuit of claim 1, wherein the cascode circuit further includes a second current source that is arranged to provide the cascode current, and a third transistor that is coupled between the cascode output node and the second node, wherein the third transistor is biased by a cascode bias signal.

6. An amplifier circuit, comprising:
   a differential pair circuit that is arranged to steer a tail current between first and second nodes in response to a differential signal;
   a current mirror circuit that is coupled to the first and second nodes, wherein the current mirror circuit is arranged to provide a reflected current to the second node when activated by at least a portion of the tail current, wherein the current mirror circuit includes a fourth transistor that is coupled between the first node and an input of the current mirror such that the current mirror circuit is cascoded; and
   a cascode circuit that is biased by a cascode current, wherein the cascode circuit is coupled between a cascode output node and the second node such that second node is isolated from the cascode output node by the cascode circuit, wherein the amplifier is arranged to provide an output current to the cascode output node, wherein the cascode circuit further includes a second current source that is arranged to provide the cascode current, and a third transistor that is coupled between the cascode output node and the second node, wherein the third transistor is biased by a cascode bias signal, wherein the third and fourth transistors have associated sizes, and wherein the size associated with the third transistor is related to the size associated with the fourth transistor such that the third and fourth transistors operate with similar current densities.

7. An amplifier circuit, comprising:
   a differential pair circuit that is arranged to steer a tail current between first and second nodes in response to a differential signal;
   a current mirror circuit that is coupled to the first and second nodes, wherein the current mirror circuit is arranged to provide a reflected current to the second node when activated by at least a portion of the tail current; and
   a cascode circuit that is biased by a cascode current, wherein the cascode circuit is coupled between a cascode output node and the second node such that second node is isolated from the cascode output node by the cascode circuit, wherein the amplifier is arranged to provide an output current to the cascode output node, wherein the cascode circuit further includes a second current source that is arranged to provide the cascode current, and a third transistor that is coupled between the cascode output node and the second node, wherein the third transistor is biased by a cascode bias signal, wherein the cascode circuit further includes a seventh transistor that is coupled between the second current source and the third transistor, wherein the seventh transistor is biased by another cascode bias signal such that the cascode output node is isolated from the second current source.

8. The amplifier circuit of claim 1, further comprising an output stage that is arranged to provide an output signal at an output node in response to an input signal at the cascode output node.

9. The amplifier circuit of claim 8, further comprising a capacitor that is coupled between the second node and the output node, wherein the capacitor is arranged to reduce the gain of the amplifier at high frequencies.

10. The amplifier circuit of claim 8, further comprising a capacitor that is coupled between the second node and the output node, wherein the amplifier has a slew rate that is determined by a value associated with the capacitor, the tail current, and the cascode current.

11. An amplifier circuit comprising:
a differential pair circuit that is arranged to steer a tail current between first and second nodes in response to a differential signal;
a current mirror circuit that is coupled to the first and second nodes, wherein the current mirror circuit is arranged to provide a reflected current to the second node when activated by at least a portion of the tail current;
a cascode circuit that is biased by a cascode current, wherein the cascode circuit is coupled between a cascode output node and the second node such that second node is isolated from the cascode output node by the cascode circuit, wherein the amplifier is arranged to provide an output current to the cascode output node;
an output stage that is arranged to provide an output signal at an output node in response to an input signal at the cascode output node; and
a capacitor that is coupled between the second node and the output node, wherein the amplifier has a slew rate that corresponds to +/−2*I/C, wherein the tail current and the cascode current have a magnitude of I, and the capacitor has a value of C.

12. An apparatus comprising:
a differential pair circuit that includes a first current source that is coupled to a third node, a first transistor that is coupled between a first node and the third node, a second transistor that is coupled between a second node and the third node, wherein the first and second transistors are arranged to steer a tail current from the first current source to the first and second nodes in response to a differential signal;
a current mirror circuit that is coupled to the first and second nodes, wherein the current mirror circuit includes a fourth transistor that is coupled between the first node and a fourth node, a fifth transistor that is coupled to the first node and the second node, and a sixth transistor that is coupled to the first node and the fourth node, wherein the fifth and sixth transistor are commonly controlled by a signal from the first node such that a reflected current is provided to the second node when the sixth transistor is activated by at least a portion of the tail current; and
a cascode circuit that includes a second current source that is coupled to a fifth node, and a third transistor that is coupled between the fifth node and the second node, wherein the third transistor is biased by a cascode bias signal such that the amplifier is arranged to provide a cascode output current to the fifth node.

13. An apparatus as in claim 12, wherein the first current source is arranged to provide a tail current having a magnitude corresponding to I1, the second current source is arranged to provide a cascode current having a magnitude corresponding to I2, and wherein a the fifth and sixth transistors have associated sizes that are related to one another by a ratio that corresponds to: $1+2*(I2/I1)$.

14. The amplifier circuit of claim 13, wherein the second transistor is arranged to provide the tail current to the second node when the fifth transistor is deactivated, and the fifth transistor is arranged to conduct another current having a magnitude corresponding to $I1+2*I2$ when the second transistor is deactivated.

15. An apparatus as in claim 12, wherein the first current source is arranged to provide a tail current having a magnitude corresponding to I1, the second current source is arranged to provide a cascode current having a magnitude corresponding to I2, and wherein a the third and fourth transistors have associated sizes that are related to one another by a ratio that corresponds to: $2*(I2/I1)$.

16. An apparatus as in claim 12, further comprising an output stage that includes an eighth transistor that is coupled to the fifth node and an output node, wherein the eighth transistor is arranged to provide an output signal to the output node in response to signals at the fifth node.

17. The amplifier circuit of claim 16, further comprising a capacitor (C) that is coupled between the second node and the output node, wherein the first current source is arranged to provide a tail current having a magnitude corresponding to I1, and the second current source is arranged to provide a cascode current having a magnitude corresponding to I2 such that the amplifier charges capacitor C with a positive slew rate (SRP) corresponding to: $SRP=(I1+I2)/C$.

18. The amplifier circuit of claim 16, further comprising a capacitor that is coupled between the second node and the output node, wherein the fifth transistor is ratioed in size to the sixth transistor according to a factor (X), the first current source is arranged to provide a tail current having a magnitude corresponding to I1, the second current source is arranged to provide a cascode current having a magnitude corresponding to I2, and transistor M1 has a parasitic capacitance (CP) that is coupled to node N3 such that the amplifier discharges capacitor C with a negative slew rate (SRN) corresponding to: $SRN=((X*I1)-I2)/(C+CP)$.

19. The amplifier circuit of claim 17, wherein the value associated with the parasitic capacitance (CP) is much less than the value associated with the capacitor (C), such that the negative slew rate (SRN) corresponds to $SRN=((X*I1)-I2)/C$.

* * * * *

UNITED STATES PATENT AND TRADEMARK OFFICE
CERTIFICATE OF CORRECTION

PATENT NO. : 6,762,646 B1
DATED : July 13, 2004
INVENTOR(S) : Bell

It is certified that error appears in the above-identified patent and that said Letters Patent is hereby corrected as shown below:

Column 4,
Line 27, "current source 11" should read -- current source I1 --.

Column 7,
Line 5, "as (I*X-I2)." should read -- as (I1*X-I2) --.

Column 10,
Line 58, "circuit of claim 17" should read -- circuit of claim 12 --.

Signed and Sealed this

Seventh Day of December, 2004

JON W. DUDAS
*Director of the United States Patent and Trademark Office*